(12) United States Patent
Lee (10) Patent No.: US 7,782,091 B2
(45) Date of Patent: Aug. 24, 2010

(54) APPARATUS, SYSTEM, AND METHOD FOR DRIVER CIRCUITS

(75) Inventor: Yan Lee, Guildford (GB)

(73) Assignee: Aptina Imaging Corporation, George Town (KY)

( * ) Notice: Subject to any disclaimer, the term of this patent is extended or adjusted under 35 U.S.C. 154(b) by 879 days.

(21) Appl. No.: 11/598,945

(22) Filed: Nov. 14, 2006

(65) Prior Publication Data

US 2008/0111904 A1    May 15, 2008

(51) Int. Cl.
   H03K 19/0175    (2006.01)
   H03K 19/094    (2006.01)
   H03K 19/003    (2006.01)
(52) U.S. Cl. .............................. 326/87; 326/30; 327/107
(58) Field of Classification Search .................... 326/26, 326/30, 82, 86, 87, 112, 119; 327/108, 109
   See application file for complete search history.

(56) References Cited

U.S. PATENT DOCUMENTS 5,602,494 A * 2/1997 Sundstrom ................... 326/39
6,114,895 A * 9/2000 Stephens ..................... 327/391
6,486,698 B2 * 11/2002 Yanagawa .................... 326/30
6,586,973 B2 * 7/2003 Yokoyama et al. .......... 327/108
7,589,554 B2 * 9/2009 Hamanaka ................... 326/30
2004/0017220 A1 * 1/2004 To et al. ...................... 326/30
2009/0002018 A1 * 1/2009 Jeong et al. .................. 326/30

* cited by examiner

Primary Examiner—Vibol Tan
Assistant Examiner—Dylan White
(74) Attorney, Agent, or Firm—David C. Kellogg (57) ABSTRACT

Some embodiments include an output driver having a first circuit to provide a plurality of first parallel circuit paths between an output node and a first supply node, a second circuit to provide a plurality of second parallel circuit paths between the output node and a second supply node, and a control circuit responsive to a voltage at the output node to vary a value of a current in the plurality of first parallel circuit paths and a value of a second current in the plurality of second parallel circuit paths to control a signal shape of the output signal. Additional apparatus, systems, and methods are disclosed.

33 Claims, 6 Drawing Sheets

APPARATUS, SYSTEM, AND METHOD FOR DRIVER CIRCUITS

FIELD

The present disclosure relates generally to semiconductor devices, including output circuitry in semiconductor devices.

BACKGROUND

Electronic devices or systems, for example, computers, cellular phones, and digital cameras, often have one or more semiconductor chips to perform one or more electrical functions. The device may include output circuitry, including output drivers, to provide information to other devices.

The information provided by an output driver of a device is usually in the form of an electrical signal. In some cases, the electrical signal provided by one device may cause interference to other devices. This kind of interference is often called electromagnetic interference (EMI). The EMI emissions from one device may cause other devices to behave irregularly.

Thus, electronic devices usually have some circuitry to assist in keeping EMI emission arising from output driver operation below some selected level to meet EMI emission standards. For some devices, however, designing output drivers to meet specific EMI emission standards can be difficult.

DETAILED DESCRIPTION OF DRAWINGS

Figure 1:
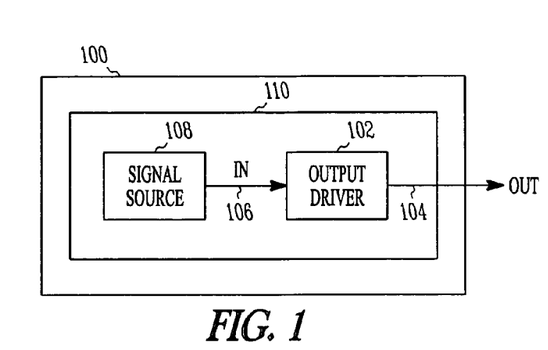
FIG. 1 shows an apparatus having a device with an output driver according to an embodiment of the invention.

FIG. 1 shows an apparatus having a device 100 with an output driver 102 according to an embodiment of the invention. Output driver 102 provides an output signal OUT at an output node 104 in response to an input signal IN at a node 106. The OUT signal may be a digital signal such that it may have one signal level (e.g., low) representing a binary zero (or logic zero) and another signal level (e.g., high) representing a binary one (or logic one). The IN signal may be provided by a signal source 108. Device 100 may include a semiconductor chip 110 having the output driver 102 and signal source 108 formed thereon.

In some embodiments, device 100 may include a complementary metal-oxide semiconductor (CMOS) image sensor device where signal source 108 may include a pixel array. In some embodiments, device 100 may include a memory device where signal source 108 may include a memory array, including memory cells. In some embodiments, device 100 may include other semiconductor devices. In addition to the circuit elements shown in FIG. 1, one skilled in the art will readily recognize that device 100 may include other circuit elements, such as the individual circuit elements of a CMOS image sensor device or a memory device. The OUT signal in FIG. 1 may be characterized as having a relatively low EMI emission as discussed below with reference to FIG. 1 and FIG. 2.

Figure 2:
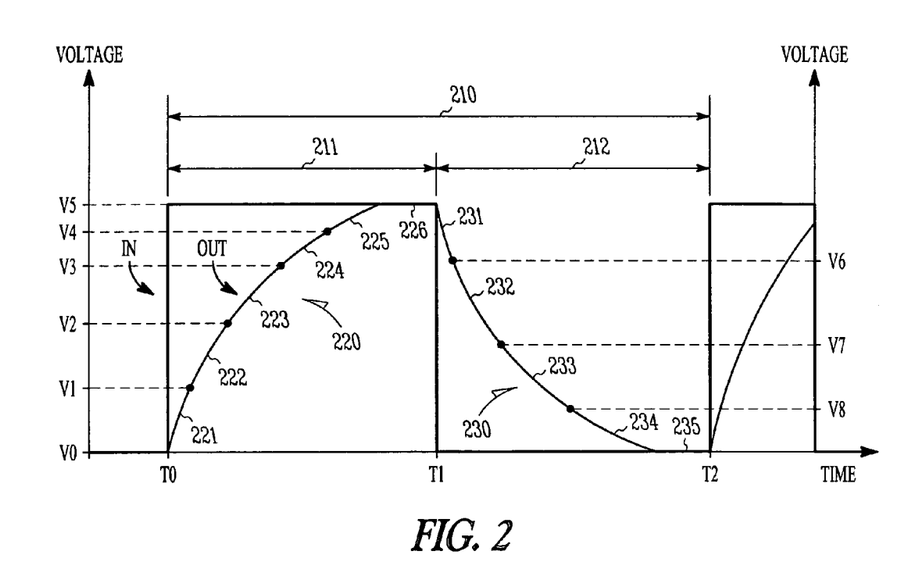
FIG. 2 is an example timing diagram for an output signal of the output driver of FIG. 1.

FIG. 2 is an example timing diagram for the OUT signal of output driver 102 of FIG. 1. In FIG. 2, V0, V1, V2, V3, V4, V5, V6, V7, and V8 represent voltages; and T0, T1, and T2 represent times. In some embodiments, V5 may be a supply voltage of device 100 and V0 may be ground.

In FIG. 2, the OUT signal may have a cycle (period) 210 time interval between times T0 and T2. A time interval 211 corresponds to a first portion of cycle 210. A time interval 212 corresponds to a second portion of cycle 210. As shown in FIG. 2, the IN signal has a high signal level corresponding to V5 during time interval 211, and a low signal level corresponding to V0 during time interval 212.

The OUT signal includes a signal portion 220 between times T0 and T1, and a signal portion 230 between times T1 and T2. Signal portion 220 includes a number of signal segments 221, 222, 223, 224, 225, and 226. Signal portion 230 includes a number of signal segments 231, 232, 233, 234 and 235. As shown in FIG. 2, signal segments 221 through 226 may have different slopes. For example, in signal portion 220, signal segment 222 has a smaller slope (rising at a lower rate) than signal segment 221. In another example, in signal portion 230, signal segment 233 has a smaller slope (falling at a lower rate) than signal segment 232.

In the description herein, a signal segment (e.g., one of signal segments 221, 222, 223, 224, 225, 226, 231, 232, 233, 234 and 235) maybe shown as a straight line. In some embodiments, the signal segment may have some curvature.

In some embodiments, based on the voltage present at output node 104, output driver 102 may reduce its drive strength such that the signal shape of the OUT signal may be tailored or controlled to reduce EMI emission at output node 104. Output driver 102 may reduce its drive strength by varying a value of a current at output node 104.

In some embodiments, during time interval 211 of FIG. 2, output driver 102 of FIG. 1 may progressively reduce the value of a current at output node 104 in a step-by-step fashion to lower the rising rate of signal portion 220. In FIG. 2, the segmented signal shape of signal portion 220 may result from the step-by-step reduction of the current of output node 104 during time interval 211.

In some embodiments, during time interval 212, output driver 102 of FIG. 1 may progressively reduce the value of a current at output node 104 in a step-by-step fashion to lower the falling rate of signal portion 230. In FIG. 2, the segmented signal shape of signal portion 230 may result from the step-by-step reduction of the current of output node 104 during time interval 212.

As described above, output driver 102 may progressively reduce its drive strength to tailor or control the signal shape of the OUT signal. As shown in FIG. 2, the signal shape of the OUT signal may be similar to a sine wave. Since a sine wave may have relatively lower EMI emissions than a square wave (e.g., the square wave signal shape of the IN signal), tailoring the shape of the OUT signal to be like a sine wave than a square wave may reduce the level of EMI emissions associated with the OUT signal.

FIG. 2 shows an example where the OUT signal includes some particular number of signal segments in each of signal portions 220 and 230. In some embodiments, the number of signal segments in signal portions 220 and 230 may be different from those shown in FIG. 2. For example, the number of signal segments in signal portion 220 and signal portion 230 may be the same; the number of signal segments in signal portion 230 may be greater than or less than the number of signal segments in signal portion 220 as well.

Figure 3:
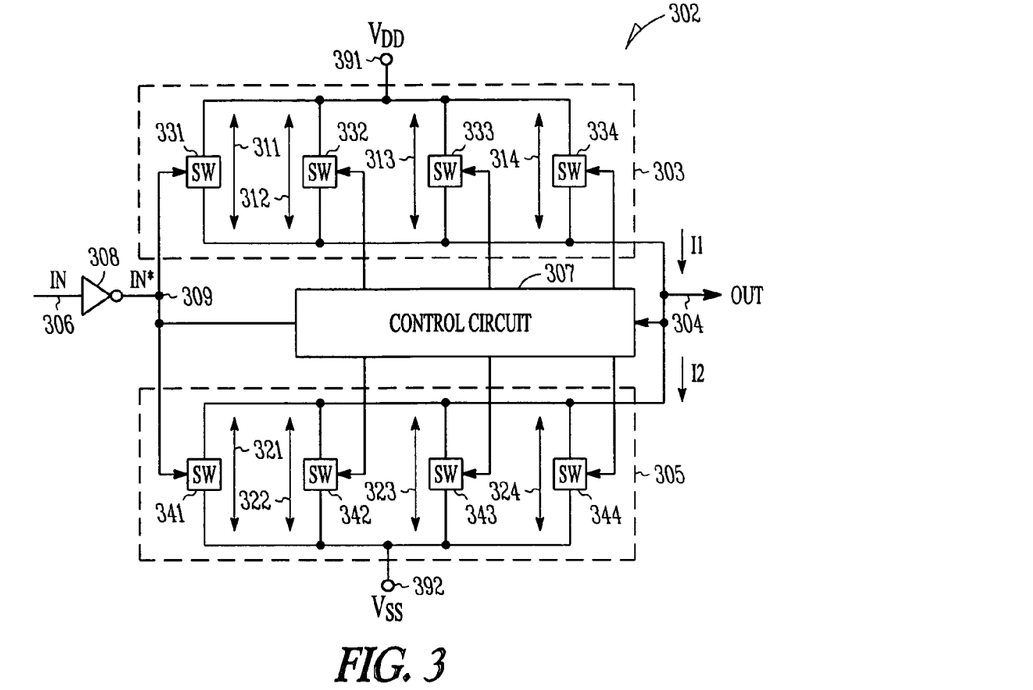
FIG. 3 shows an output driver with parallel circuit paths according to an embodiment of the invention.
Figure 5:
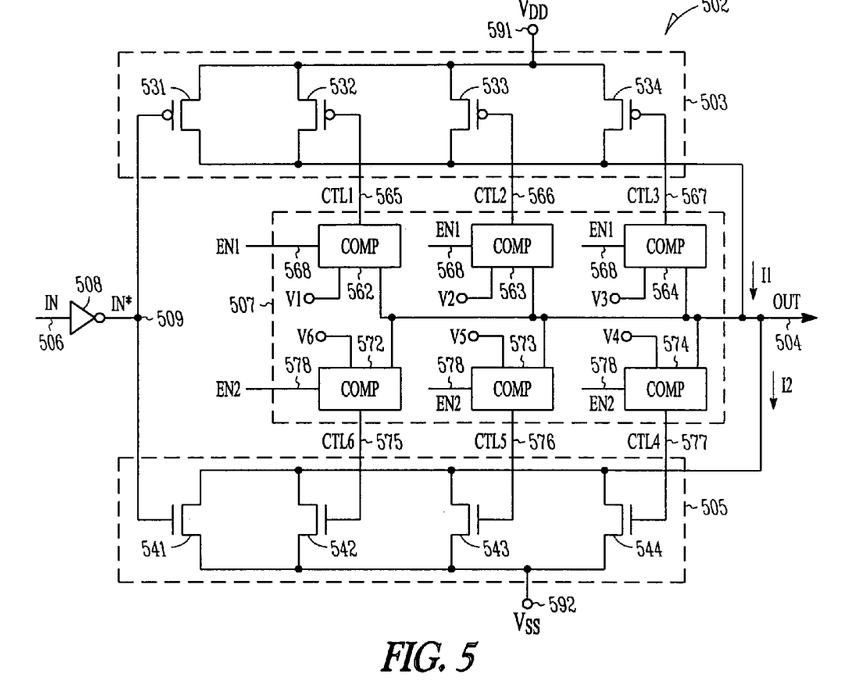
FIG. 5 shows an output driver with comparators according to an embodiment of the invention.
Figure 7:
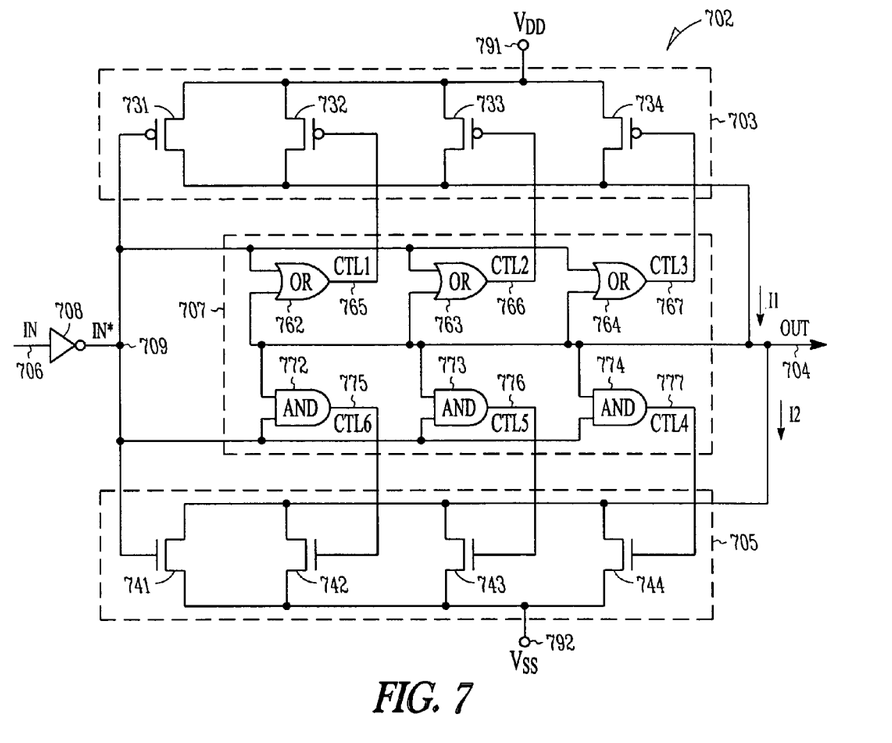
FIG. 7 shows an output driver with logic gates according to an embodiment of the invention.

In some embodiments, output driver 102 may include one or more embodiments of output drivers, similar to or identical to those labeled 302 in FIG. 3, 502 in FIG. 5, and 702 of FIG. 7.

FIG. 3 shows an output driver 302 with parallel circuit paths according to an embodiment of the invention. Output driver 302 provides an output signal OUT at an output node 304 in response to an input signal IN at a node 306. An inverter 308 provides at a node 309 a signal IN*, which is an inversion of the IN signal. Output driver 302 includes a circuit 303 to provide circuit paths 311, 312, 313, and 314 in parallel between a supply node 391 and the output node 304, a circuit 305 to provide circuit paths 321, 322, 323, and 324 in parallel between output node 304 and a supply node 392, and a control circuit 307. Supply node 391 may be coupled to a voltage VDD. Supply node 392 may be coupled to a voltage VSS. In some embodiments, VDD may be a supply voltage for output driver 302 and VSS may be ground.

FIG. 3 shows an example where circuit 303 includes four circuit paths 311, 312, 313, and 314. In some embodiments, the number of circuit paths in circuit 303 may be more or less. FIG. 3 also shows an example where circuit 305 includes four circuit paths 321, 322, 323, and 324. In some embodiments, the number of circuit paths in circuit 305 may be more or less.

In FIG. 3, circuit paths 311, 312, 313, and 314 may include switches 331, 332, 333, and 334. Circuit paths 321, 322, 323, and 324 may include switches 341, 342, 343, and 344.

In some embodiments, switches 331 and 341 may form an alternating switch pair that may response to the IN signal in fashion such that when circuit path 311 is enabled, circuit path 321 is disabled, and when circuit path 311 is disabled, circuit path 321 is enabled. For example, switch 331 may be turned on to enable circuit path 311 when the IN signal has a first signal level (e.g., high), and turned off to disable circuit path 311 when the IN signal has a second signal level (e.g., low). In another example, switch 341 may be turned off to disable circuit path 321 when the IN has a first signal level (e.g., high), and turned on to enable circuit path 321 when the IN has a second signal level (e.g., low).

In some embodiments, at least one of switches 331, 332, 333, and 334 may include a transistor or a variable resistor. In some embodiments, switches 332, 333, and 334 may respond to control circuit 307 to enable and disable a corresponding circuit path among circuit paths 312, 313, and 344.

In some embodiments, at least one of switches 341, 342, 343, and 344 may include at least one transistor or a variable resistor. In some embodiments, switches 342, 343, and 344 may respond to control circuit 307 to enable and disable a corresponding circuit path among circuit paths 322, 323, and 324.

In FIG. 3, I1 represents a total of current in circuit paths 311, 312, 313, and 314 between supply node 391 and output node 304. I2 represents a total of current in circuit paths 321, 322, 323, and 324 between output node 304 and supply node 392. Current may flow through a particular circuit path (e.g., circuit path 312) when that particular circuit path (e.g., circuit path 312) is enabled. Current may stop flowing through a particular circuit path when that particular circuit path is disabled. Thus, the value of I1 may be varied by enabling and disabling different combinations of circuit paths 311, 312, 313, and 314. Similarly, the value of I2 may be varied by enabling and disabling different combinations of circuit paths 321, 322, 323, and 324.

In some embodiments, based on the voltage present at output node 304, control circuit 307 may enable and disable different combination of the circuit paths 311, 312, 313, and 314 and different combination circuit paths 321, 322, 323, and 324 to vary the value of I1 and I2 and control the signal shape of the OUT signal.

Figure 4:
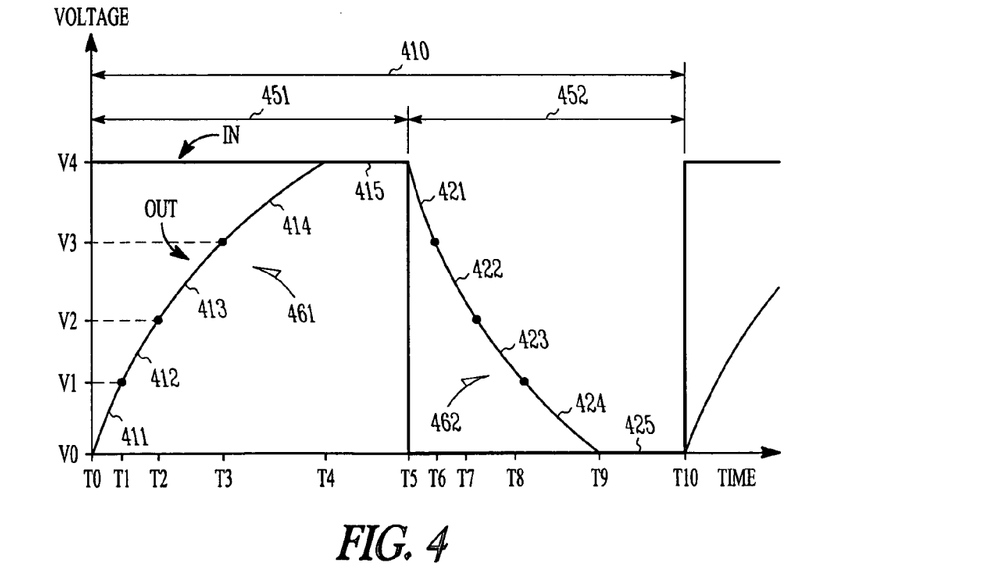
FIG. 4 is an example timing diagram for an output signal of the output driver of FIG. 3.

FIG. 4 is an example timing diagram for the OUT signal of output driver 302 of FIG. 3. In FIG. 4, V0, V1, V2, V3, and V4 represent voltages, each of which may be proportional to VDD (FIG. 3). V4 in FIG. 4 may be similar to or identical to VDD in FIG. 3.

In FIG. 4, the OUT signal has a cycle 410 time interval. The OUT signal includes a signal portion 461 (rising signal portion) during a time interval 451, and a signal portion 462 (falling signal portion) during a time interval 452. As shown in FIG. 4, the shape of the OUT signal may be a segmented signal shape such that each of signal portions 461 and 462 may include a number of signal segments, as described in detailed below with reference to FIG. 3 and FIG. 4.

In FIG. 4, at time T0, the IN signal may rise to V4. In response to the rise of the IN signal, switch 331 may be turned on to enable circuit path 311, and switch 341 may be turned off to disable circuit path 321. Control circuit 307 may enable all circuit paths 312, 313, and 314 and disable all circuit paths 322, 323, and 324. I2 may stop flowing or may be absent. I1 may be generated and flow between supply node 391 and output node 304.

In the description herein, "between" two particular times means the time interval that includes all time between the two particular stated times, as well as the instants marked by the two particular times. For example, between times T0 and T1 means the time interval between times T0 and T1 including the instant of times T0, T1, or both times T0 and T1.

In FIG. 4, between times T0 and T1, all circuit paths 311, 312, 313, and 314 may be enabled, output driver 302 may source a maximum output current at output node 304. That is, the value of I1 may be at a maximum value when all circuit paths 311, 312, 313, and 314 are enabled in comparison with a relatively lower value of I1 when fewer than all circuit paths 311, 312, 313, and 314 are enabled. Between times T0 and T1, signal portion 461 of the OUT signal may have a signal segment 411 as the voltage at output node 304 increases from V0.

Between times T1 and T2 in FIG. 4, when the voltage at output node 304 is equal to or greater than (at least equal to) V1, control circuit 307 may disable one of circuit paths 312, 313, and 314 to reduce the value of I1. For example, control circuit 307 may disable circuit path 312, thereby reducing the number of enabled circuit paths between supply node 391 and output node 304 to paths 311, 313, and 314. Since the number of enabled circuit paths between supply node 391 and output node 304 is reduced, the value of I1 is also reduced, causing the slope of signal portion 461 to decrease. Thus, the OUT signal may rise at a lower rate between times T1 and T2 than between times T0 and T1. As shown in FIG. 4, between times T1 and T2, signal portion 461 may have a signal segment 412 with a slope that is less than the slope of signal segment 411.

Between times T2 and T3, when the voltage at output node 304 is equal to or greater than V2, control circuit 307 may disable another one of circuit paths 312, 313, and 314 to reduce the value of I1. For example, control circuit 307 may disable circuit path 313 (in addition to the disabled circuit path 312), thereby further reducing the number of enabled circuit paths between supply node 391 and output node 304 to paths 311 and 314. Thus, the value of I1 may be further reduced, causing the slope of signal portion 461 to further decrease. The OUT signal may rise at a lower rate between times T2 and T3 than between times T1 and T2. As shown in FIG. 4, between times T2 and T3, signal portion 461 may have a signal segment 413 with a slope that is less than the slope of the signal segment 412.

Between times T3 and T4, when the voltage at output node 304 is equal to or greater than V3, control circuit 307 may disable an additional one of circuit paths 312, 313, and 314 to reduce the value of I1. For example, control circuit 307 may disable circuit path 314 (in addition to the disabled circuit paths 312 and 313). Therefore, the value of I1 may be reduced by an additional current amount, via path 311, causing the slope of signal portion 461 to further decrease. The OUT signal may rise at a lower rate between times T3 and T4 than between times T2 and T3. As shown in FIG. 4, between times T3 and T4, signal portion 461 may have a signal segment 414 with a slope that is less than the slope of the signal segment 413.

Between times T4 and T5, with one circuit path (e.g., circuit path 311) being enabled, signal portion 461 may have a signal segment 415, which may correspond to the voltage at output node 304 reaching V4. FIG. 4 shows an example where signal segments 414 and 415 have different slopes. In some embodiments, signal segments 414 and 415 may have substantially similar slopes.

As shown in FIG. 4, signal portion 461 includes a number of signal segments 411, 412, 413, 414, and 415, which may be produced by control circuit 307 (FIG. 3) varying the value of I1 at various times during time interval 451.

Control circuit 307 may operate in a similar fashion to progressively vary the value of I2 during time interval 452 to control the signal shape of signal portion 462 between times T5 and T10.

At time T5, the IN signal may fall to V0. In response to the fall of the IN signal, switch 331 may be turned off to disable circuit path 311, switch 341 may be turned on to enable circuit path 321. Control circuit 307 may enable all circuit paths 322, 323, and 324. I1 may stop flowing. I2 may be generated and flow between output node 304 and supply node 392.

Between times T5 and T6, all circuit paths 321, 322, 323, and 324 may be enabled, output driver 302 may sink a maximum output current from output node 304. That is, the value of I2 may be at a maximum value when circuit paths 321, 322, 323, and 324 are enabled in comparison with a relatively a lower value of I2 when fewer than all circuit paths 321, 322, 323, and 324 are enabled. Between times T5 and T6, signal portion 462 of the OUT signal may have a signal segment 421 as the voltage at output node 304 decreases from V4.

Between times T6 and T7, when the voltage at output node 304 is equal to or less than V3, control circuit 307 may disable one of circuit paths 322, 323, and 324 to reduce the value of I2. For example, control circuit 307 may disable circuit path 322, thereby reducing the number of enabled circuit paths between output node 304 and supply node 392 to paths 321, 323, and 324. Since the number of enabled circuit paths between supply node 392 and output node 304 is reduced, the value of I2 may be reduced, causing the slope of signal portion 462 to decrease. Thus, the OUT signal may fall at a lower rate between times T6 and T7 than between times T5 and T6. As shown in FIG. 4, between times T6 and T7, signal portion 462 may have a signal segment 422 with a slope that is less than the slope of signal segment 421.

Between times T7 and T8, when the voltage at output node 304 is equal to or less than V2, control circuit 307 may disable another one of circuit paths 322, 323, and 324 to reduce the value of I2. For example, control circuit 307 may disable circuit path 323 (in addition to the disabled circuit path 322), thereby further reducing the number of enabled circuit paths between output node 304 and supply node 392 to paths 321 and 324. Thus, the value of I2 may be further reduced, causing the slope of signal portion 462 to further decrease. The OUT signal may fall at a lower rate between times T7 and T8 than between times T6 and T7. As shown in FIG. 4, between times T7 and T8, signal portion 462 may have a signal segment 423 with a slope that is less than the slope of the signal segment 422.

Between times T8 and T9, when the voltage at output node 304 is equal to or less than V1, control circuit 307 may disable an additional one of circuit paths 322, 323, and 324 to reduce the value of I2. For example, control circuit 307 may disable circuit path 324 (in addition to the disabled circuit paths 322 and 323), thereby further reducing the number of enabled circuit paths between output node 304 and supply node 392 to path 321. Thus, the value of I2 may be reduced by an additional current amount, causing the slope of signal portion 462 to further decrease. The OUT signal may fall at a lower rate between times T8 and T9 than between times T7 and T8. As shown in FIG. 4, between times T8 and T9, signal portion 462 may have a signal segment 424 with a slope that is less than the slope of the signal segment 423.

Between times T9 and T10, with one circuit path (e.g., circuit path 321) being enabled, signal portion 462 may have a signal segment 425, which may corresponds to the voltage at output node 304 reaching V0. FIG. 4 shows an example where signal segments 424 and 425 with have slopes. In some embodiments, signal segments 424 and 425 may have substantially similar slopes.

As shown in FIG. 4, signal portion 462 includes a number of signal segments 421, 422, 423, 424, and 425, which may be produced by control circuit 307 (FIG. 3) varying the value of I2 at various times during time interval 452.

The description of FIG. 3 and FIG. 4 above shows that I1 may be varied at various times during time interval 451 and that I2 may be varied at various times during time interval 452 to control the signal shape of the OUT signal such that the OUT signal may include a segmented signal shape as shown in FIG. 4.

The description of FIG. 3 and FIG. 4 above shows an example where only one circuit path (e.g., circuit path 311) remains enabled between times T4 and T5. In some embodiments, at least two circuit paths (e.g., circuit path 311 and one or more of circuit paths 312, 313, and 314) may remain enabled between times T4 and T5. Similarly, the description of FIG. 3 and FIG. 4 above shows an example where only one circuit path (e.g., circuit path 321) may remain enabled between times T9 and T10. In some embodiments, at least two circuit paths (e.g., circuit path 311 and one or more of circuit paths 322, 323, and 324) may remain enabled between times T9 and T10.

FIG. 4 shows an example where the voltages at output node 304 at times T6, T7, and T8 are about V3, V2, and V1, respectively. In some embodiments, the voltages at output node 304 at times T6, T7, and T8 may be different from those shown in FIG. 4. For example, the voltage at output node 304 at time T6 may be higher or lower than V3, the voltage at output node 304 at time T7 may be higher or lower than V2, and the voltage at output node 304 at time T8 may be higher or lower than V1.

As described above, output driver 302 may vary I1 and I2 based on the voltage at output node 304 to control the signal shape of the OUT signal such that the OUT signal may have relatively low EMI emission characteristics compared with what might occur if the OUT signal was given a more square-wave like shape, rather than the segmented shape shown in FIG. 4.

In some embodiments, output driver 302 of FIG. 3 may include one or more embodiments of output driver 502 (FIG. 5) and output driver 702 (FIG. 7).

FIG. 5 shows an output driver 502 with comparators according to an embodiment of the invention. Output driver 502 provides an output signal OUT at an output node 504 in response to an input signal IN at a node 506. An inverter 508 provides at a node 509 a signal IN*, which is an inversion of the IN signal.

In FIG. 5, output driver 502 may include a circuit 503 having transistors 531, 532, 533, and 534 coupled in parallel between output node 504 and a supply node 591. Each of transistors 531, 532, 533, and 534 may provide a separate circuit path between a supply node 591 and output node 504. Transistors 531, 532, 533, and 534 may include transistors of a first transistor type such as p-channel (PMOS) transistors as shown in FIG. 5.

A circuit 505 includes transistors 541, 542, 543, and 544 coupled in parallel between output node 504 and a supply node 592. Each of transistors 541, 542, 543, and 544 may provide a separate circuit path between output node 504 and a supply node 592. Transistors 541, 542, 543, and 544 may include transistors of a second transistor type such as n-channel (NMOS) transistors as shown in FIG. 5. In some embodiments, transistors 531 and 541 may form a CMOS inverter.

A control circuit 507 may include comparators 562, 563, 564, 572, 573, and 574. As shown in FIG. 5, each comparator (COMP) includes a first input node coupled to output node 504, a second input node coupled to receive one of voltages V1, V2, V3, V4, V5, and V6, and a comparator output node (e.g., node 565, 566, 567, 575, 576, or 577) coupled to the gate of one of transistors 532, 533, 534, 542, 543, and 544.

A control signal EN1 on node 568 may be used to activate and deactivate comparators 562, 563, and 564. For example, comparators 562, 563, and 564 may be activated when the EN1 signal has a first signal level (e.g., low) and deactivated when the EN1 signal has a second signal level (e.g., high). Other activation polarities may be used.

A control signal EN2 on node 578 may be used to activate and deactivate comparators 572, 573, and 574. For example, comparators 572, 573, and 574 may be deactivated when the EN2 signal has a first signal level (e.g., low) and activated when the EN2 signal has a second signal level (e.g., high). Other activation polarities may be used.

In some embodiments, both EN1 and EN2 signals may be provided by node 509 such that both EN1 and EN2 signals may be the same as the IN* signal. Thus, in some embodiments, nodes 568 and 578 may be coupled to node 509.

In FIG. 5, V1, V2, and V3 may have different voltage values. For example, V1 may be less than V2, and V2 may be less than V3. In some embodiments, each of V1, V2, and V3 may be proportional to VDD. For example, V1 may be X*VDD (or X times VDD), V2 may be Y*VDD, and V3 may be Z*VDD, where each of X, Y, and Z is a real number. In some embodiments, each of X, Y, and Z may be less than 1. For example, X may be 0.25, Y may be 0.5, and Z may be 0.75. Other values of X, Y, and Z may be used.

In some embodiments, the relationship among V1, V2, V3, and VDD may be linear. For example, V1 may be (1/N)*VDD, V2 may be (2/N)*VDD, and V3 may be ((N−1)/N)*VDD, where N is the number of transistors coupled between supply node 591 and output node 504. In some embodiments, V1, V2, V3, and VDD may have other relationships, including nonlinear relationships. For example, V1 may be ((1+(1/N))/2)*VDD, V2 may be ((1+(2/N))/2)*VDD, and V3 may be (((1+(N−1))/N))/2)*VDD. In FIG. 5, N is four. In some embodiments, the number of transistors (e.g., N) may be more or less.

In FIG. 5, V4, V5, and V6 may have different voltage values. For example, V4 may be greater than V5, and V5 may be less than V6. In some embodiments, V4 may be equal to V3, V5 may be equal to V2, and V6 may be equal to V1. In some embodiments, each of V4, V5, and V6 may be proportional to VDD. For example, V4 may be D*VDD, V5 may be E*VDD, and V6 may be F*VDD, where each of D, E, and F is a real number. In some embodiments, each of D, E, and F may be less than 1. For another example, V4 may be ((M−1)/M)*VDD, V5 may be (2/M)*VDD, and V6 may be (1/M)*VDD, and where M is the number of transistors coupled between output node 504 and supply node 592. In other embodiments, V4 may be ((1+(1/M))/2)*VDD, V5 may be ((1+(2/M))/2)*VDD, and V6 may be (((1+(M−1)/M))/2)*VDD. Thus, as noted above, the relationship between VDD and V4, V5, and V6 may be linear or nonlinear. In FIG. 5, M is four. In some embodiments, the number of transistors between output node 504 and supply node 592 (e.g., M) may be more or less.

I1 in FIG. 5 represents a total current flowing through transistors 531, 532, 533, and 534 between supply node 591 and output node 504. I2 represents a total of current through transistors 541, 542, 543, and 544 between output node 504 and supply node 592. The value of I1 may be varied by turning on and off different number of transistors 531, 532, 533, and 534. The value of I2 may be varied by turning on and off different number of transistors 541, 542, 543, and 544.

Comparators 562, 563, and 564 may respond to voltages V1, V2, and V3 and the voltage at output node 504 to turn on and off a different number of transistors 532, 533, and 534 to vary the value of I1 and control the signal shape of a first portion of the OUT signal. Comparators 572, 573, and 574 may respond to voltages V4, V5, and V6 and the voltage at output node 504 to turn on and off different number of transistors 542, 543, and 544 to vary the value of I2 and control the signal shape of a second portion of the OUT signal.

Figure 6:
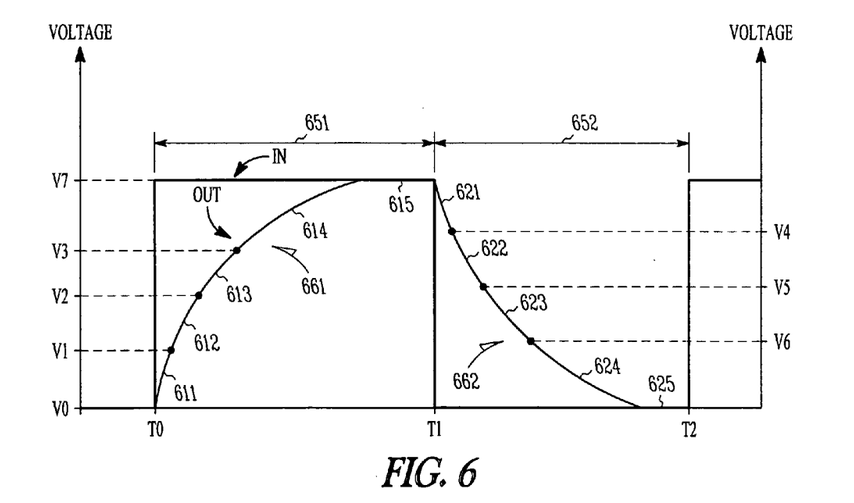
FIG. 6 is an example timing diagram for an output signal of the output driver of FIG. 5.

FIG. 6 is an example timing diagram for the OUT signal of output driver 502 of FIG. 5. As shown in FIG. 6, the OUT signal has a signal portion 661 during a time interval 651 and a signal portion 662 during a time interval 652. The shape of the OUT signal may be a segmented signal shape such that each of signal portions 661 and 662 includes a number of signal segments, as described in detail below with reference to FIG. 5 and FIG. 6.

As shown in FIG. 6, signal portion 661 may include signal segments 611, 612, 613, 614, and 615 with different slopes. Each of signal segments 611, 612, 613, 614, and 615 may be generated based on a different value of I1. Signal portion 662 includes signal segments 621, 622, 623, 624, and 625 with different slopes. Each of signal segments 621, 622, 623, 624, and 625 may be generated based on a different value of I2.

FIG. 6 shows an example where signal segments 614 and 615 have different slopes. In some embodiments, signal segments 614 and 615 may have similar slopes. FIG. 6 shows an example where signal segments 624 and 625 have different slopes. In some embodiments, signal segments 624 and 625 may have similar slopes.

V7 of FIG. 6 may be similar to or identical to VDD of FIG. 5. V0 of FIG. 6 may be similar to or identical to VSS of FIG. 5.

In FIG. 6, before time T0, both IN and OUT signals may be at V0. All transistors 531, 532, 533, 534, 542, 543, and 544 may be turned off. Each of the signals CTL4, CTL5, and CTL6 may have a low signal level. Each of the signals CTL1, CTL2, and CTL3 may have a high signal level. I2 may stop flowing or may be absent. Transistor 541 may be the only transistor that is turned on.

At time T0, the IN signal may rise from V0 to V7, and transistor 541 may be turned off. Some time after time T0, transistor 531 may be turned on. Each of the signals CTL1, CTL2, and CTL3 may change to a low signal level. Transistors 532, 533, and 534 may be turned on. Thus, all transistors 531, 532, 533, and 534 may be turned on some time after time T0. I1 may be generated and flow between supply node 591 and output node 504. Signal segment 611 may be produced as a result.

Between times T0 and T1, comparators 562, 563 and 564 may compare the voltage at output node 504 with V1, V2, and V3 to selectively turn off transistors 532, 533, and 534 one by one to progressively reduce the value of I1 to control the signal shape of signal portion 661.

For example, when the voltage at output node 504 is equal to or greater than V1, comparator 562 may change the CTL1 signal from a low signal level to a high signal level to turn off transistor 532 to reduce the value of I1 by a first current amount. In another example, when the voltage at output node 504 is equal to or greater than V2, comparator 563 may change the CTL2 signal level from a low signal level to a high signal level to turn off transistor 533 to reduce the value of I1 by a second current amount. In a further example, when the voltage at output node 504 is equal to or greater than V3, comparator 563 may change the CTL3 signal from a low signal level to a high signal level to turn off transistor 534 to reduce the value of I1 by a third current amount. Thus, during time interval 651 between times T0 and T1, I1 may have an initial value when all transistors 531, 532, 533, and 534 are turned on. The initial value of I1 may be progressively reduced based on the voltage of output node 504. The reduction in the value of I1 may control the signal shape of signal portion 661 by causing signal portion 661 to rise at a lower rate such that signal segments 611, 612, 613, 614, and 615 may have different slopes, as shown in FIG. 6.

In some embodiments, the rate of the reduction in the value of I1 may be proportional to the relationship between V1, V2, V3, and V7. For example, when V1 is about 0.25*V7, V2 is about 0.5*V7, and V3 is about 0.75*V7, the initial value of I1 (when all transistors 531, 532, 533, and 534 are turned on) may be reduced by 25% when one of transistors 531, 532, 533, and 534 is turned off, by 50% when two of transistors 531, 532, 533, and 534 are turned off, and by 75% when three of transistors 531, 532, 533, and 534 are turned off.

In FIG. 6, at time T1, the IN signal may fall to V0, transistor 531 may be turned off. I1 may stop flowing. Some time after time T1, transistor 541 may be turned on. Each of the signals CTL4, CTL5, and CTL6 may change to a high signal level. Transistors 542, 543, and 544 may be turned on. Thus, all transistors 541, 542, 543, and 544 may be turned on some time after time T1. I2 may be generated and flow between output node 504 and supply node 592. Signal segment 621 may be produced as a result.

Between times T1 and T2, comparators 572, 573 and 574 may compare the voltage at output node 504 to selectively turn off transistors 542, 543, and 544 one by one to progressively reduce the value of I1 to control the shape of signal portion 661.

For example, when the voltage at output node 504 is equal to or less than V4, comparator 574 may change the CTL4 signal from a high signal level to a low signal level to turn off transistor 544 to reduce the value of I2 by some current amount. In another example, when the voltage at output node 504 is equal to or less than V5, comparator 573 may change the CTL5 signal from a high signal level to a low signal level to turn off transistor 543 to reduce the value of I2 by another current amount. In a further example, when the voltage at output node 504 is equal to or less than V6, comparator 572 may change the CTL6 signal from a high signal level to a low signal level to turn off transistor 542 to reduce the value of I2 by an additional current amount. Thus, during time interval 651 between times T1 and T2, I2 may have an initial value when all transistors 541, 542, 543, and 544 are turned on. The initial value of I2 may be progressively reduced based on the voltage of output node 504. The reduction in the value of I2 may control the signal shape of signal portion 662 by causing signal portion 661 to fall at a lower rate such that signal segments 621, 622, 623, 624, and 625 may have different slopes, as shown in FIG. 6.

In some embodiments, the rate of the reduction in the value of I2 may be proportional to the relationship between V4, V5, V6, and V7. For example, when V4 is about 0.75*V7, V5 is about 0.5*V7, and V6 is about 0.25*V7, the initial value of I2 (when all transistors 541, 542, 543, and 544 are turned on) may be reduced by 25% when one of transistors 541, 542, 543, and 544 is turned off, by 50% when two of transistors 541, 542, 543, and 544 are turned off, and by 75% when three of transistors 541, 542, 543, and 544 are turned off.

As described above, output driver 502 may vary I1 and I2 based on the voltage at output node 504 to control the signal shape of the OUT signal such that the OUT signal may have a relatively low EMI emission.

As described with reference to FIG. 5 and FIG. 6, comparators 562, 563, 564, 572, 573, and 574 may use V1, V2, V3, V4, V5, and V6 to change the levels of the CTL1, CTL2, CTL3, CLT4, CLT5, and CLT6 signals to turn off transistors 532, 534, 534, 542, 543, and 544 at various times, controlling the signal shape of the OUT signal. Thus, by adjusting the voltage values of V1, V2, V3, V4, V5, and V6, the signal shape of the OUT signal may also by adjusted. Therefore, in some embodiments, different signal shapes for the OUT signal may be obtained by adjusting the voltage values for V1, V2, V3, V4, V5, and V6.

In some embodiments, output driver 502 may be programmable to adjust a voltage value of each of V1, V2, V3, V4, V5, and V6 such that different signal shapes for the OUT signal in FIG. 6 may be obtained. For example, in some embodiments, control circuit 507 of FIG. 5 may include a resistor reference voltage ladder to provide V1, V2, V3, V4, V5, and V6 to comparators 562, 563, 564, 572, 573, and 574 in which the voltage values for V1, V2, V3, V4, V5, and V6 may be adjusted by adjusting the resistor reference voltage ladder.

In some embodiments, the output driver 502 may include an embodiment of the output driver 702 shown in FIG. 7.

FIG. 7 shows an output driver 702 with logic gates according to an embodiment of the invention. Output driver 702 provides an output signal OUT at an output node 704 in response to an input signal IN at node 706. An inverter 708 provides a signal IN* at node 709, which is an inversion of the IN signal.

A circuit 703 includes transistors 731, 732, 733, and 734 coupled in parallel between output node 704 and a supply node 791.

A circuit 705 includes transistors 741, 742, 743, and 744 coupled in parallel between output node 704 and a supply node 792.

A control circuit 707 includes logic OR gates 762, 763, and 764 with OR gate output nodes 765, 766, and 767 and corresponding control signals CTL1, CTL2, and CTL3. Each of the logic OR gates 762, 763, and 764 includes a first input node coupled to node 709 and a second input node coupled to output node 704. Logic OR gates 762, 763, and 764 may have different switching thresholds and act as voltage comparators in which reference voltages (e.g., similar to V1, V2, and V3 of FIG. 5) may be built-in (built-in reference voltages) among logic OR gates 762, 763, and 764. The different switching thresholds among logic OR gates 762, 763, and 764 may allow logic OR gates 762, 763, and 764 to selectively change the CTL1, CTL2, and CTL3 signals from one signal level to another signal level based on different voltages at output node 704.

Figure 9:
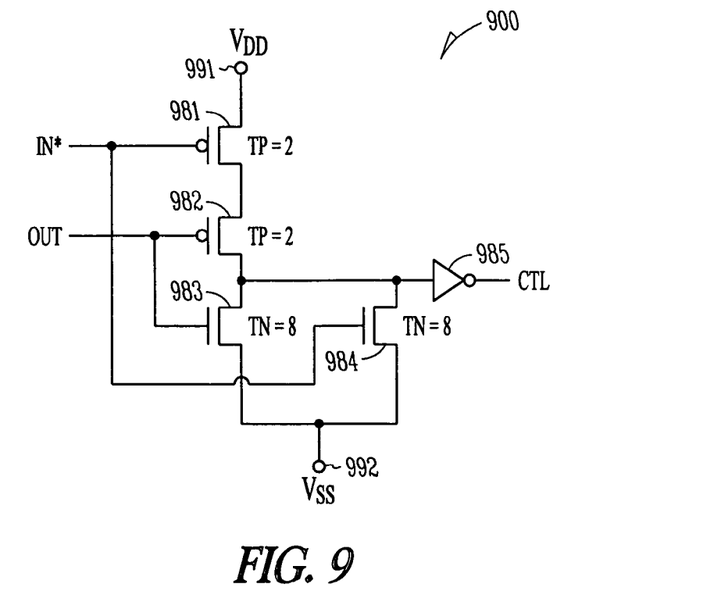
FIG. 9 shows an example of a logic OR gate arrangement according to an embodiment of the invention.

FIG. 9, described below, shows an embodiment of logic OR gates 762, 763, and 764 with different switching thresholds. In some embodiments, logic OR gates 762, 763, and 764 of FIG. 7 may be included in comparators 562, 563, and 564 of FIG. 5 such that V1, V2, and V3 in FIG. 5 may include built-in reference voltages among logic OR gates 762, 763, and 764 of FIG. 7 and node 568 in FIG. 5 may be coupled to the first input of each of logic OR gates 762, 763, and 764 of FIG. 7.

Control circuit 707 in FIG. 7 also includes logic AND gates 772, 773, and 774 with AND gate output nodes 775, 776, and 777, and corresponding control signal CTL4, CTL5, and CTL6. Each of logic AND gates 772, 773, and 774 includes a first input node coupled to node 709 and a second input node coupled to output node 704. Logic AND gates 772, 773, and 774 may have different switching thresholds and act as voltage comparators in which reference voltages (e.g., similar to V4, V5, and V6 of FIG. 5) may be built-in among logic AND gates 772, 773, and 774. The different switching thresholds among logic AND gates 772, 773, and 774 may allow logic AND gates 772, 773, and 774 to selectively change the CTL4, CTL5, and CTL6 signals from one signal level to another signal level based on different voltages at the output node 704.

Figure 10:
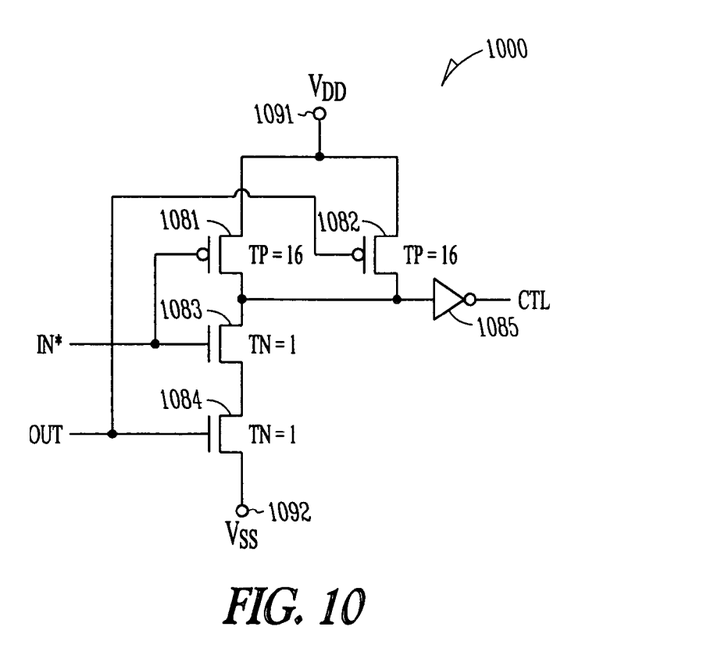
FIG. 10 shows an example of a logic AND gate arrangement according to an embodiment of the invention.

FIG. 10, described below, shows an embodiment of logic AND gates 772, 773, and 774 with different switching thresholds. In some embodiments, logic AND gates 772, 773, and 774 of FIG. 7 may be included in comparators 572, 573, and 574 of FIG. 5 such that V4, V5, and V6 in FIG. 5 may be built-in voltage references among logic AND gates 772, 773, and 774 of FIG. 7 and node 578 in FIG. 5 may be coupled to the first input of each of logic AND gates 772, 773, and 774.

In FIG. 7, I1 represents a total of current flowing through transistors 731, 732, 733, and 734 between supply node 791 and output node 704. I2 represents a total of current through transistors 741, 742, 743, and 744 between output node 704 and supply node 792.

Logic OR gates 762, 763, and 764 may respond to a voltage at node 709 and a voltage at output node 704 to turn on and off different number of transistors 731, 732, 731, and 734 to vary the value of I1 and control the signal shape of a first portion of the OUT signal. Logic AND gates 772, 773, and 774 may respond to the voltage at node 709 and a voltage at output node 704 to turn on and off different number of transistors 741, 742, 743, and 744 to vary the value of I2 and control the signal shape of a second portion of the OUT signal.

Figure 8:
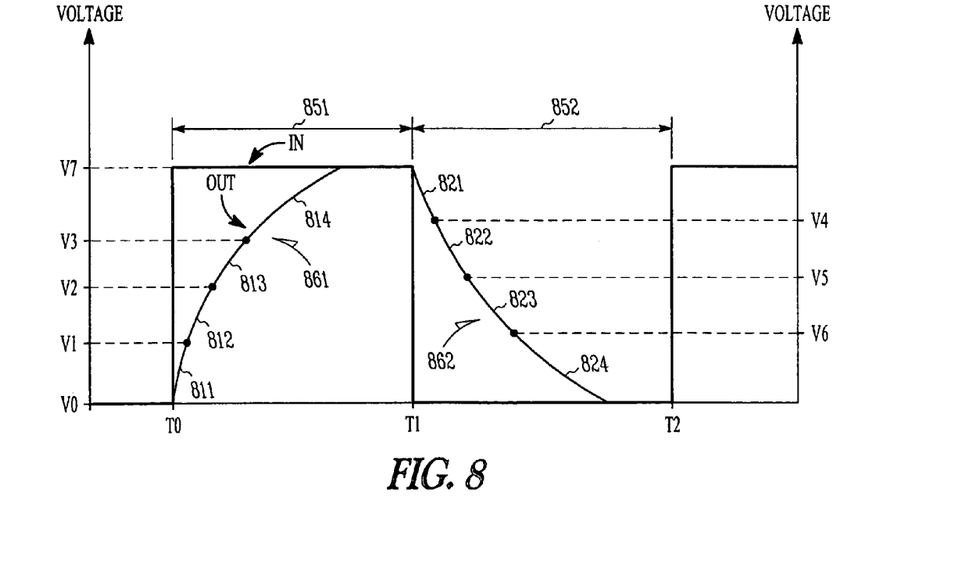
FIG. 8 is an example timing diagram for an output signal of the output driver of FIG. 7.

FIG. 8 is an example timing diagram for the OUT signal of output driver 702 of FIG. 7. As shown in FIG. 8, the OUT signal has a signal portion 861 during a time interval 851 and a signal portion 862 during a time interval 852. The shape of the OUT signal may be a segmented signal shape such that each of signal portions 861 and 862 includes a number of signal segments, as described in detail below with reference to FIG. 7 and FIG. 8.

In FIG. 8, before time T0, both IN and OUT signals may be at V0. All transistors 731, 732, 733, 734, 742, 743, and 744 may be turned off. Each of the CTL4, CTL5, and CTL6 signals may have a low signal level. Each of the CTL1, CTL2, and CTL3 signals may have a high signal level. I2 may stop flowing or may be absent. Transistor 741 may be the only transistor that is turned on.

At time T0, the IN signal may rise from V0 to V7, and transistor 741 may be turned off. Some time after time T0, transistor 731 may be turned on. Each of the CTL1, CTL2, and CTL3 signals may change to a low signal level. Transistors 732, 733, and 734 may be turned on. Thus, all transistors 731, 732, 733, and 734 may be turned on some time after time T0. I1 may be generated and flow between supply node 791 and output node 704. Signal segment 811 may be generated.

When the voltage at output node 704 is equal to or greater than V1, logic OR gate 762 may change the CTL1 signal to a high signal level. Transistor 732 may be turned off. As a result, the value of I1 may be reduced by some current amount, causing the slope of signal portion 861 to decrease. As shown in FIG. 8, signal portion 861 may have a signal segment 812 with a slope less than that of signal segment 811.

When the voltage at output node 704 is equal to or greater than V2, logic OR gate 763 may change the CTL2 signal to a high signal level. Transistor 733 may be turned off. As a result, the value of I1 may be reduced by another current amount, causing the slope of signal portion 861 to decrease again. As shown in FIG. 8, signal portion 861 may have a signal segment 813 with a slope less than that of signal segment 812.

When the voltage at output node 704 is equal to or greater than V3, logic OR gate 764 may change the CTL3 signal to a high signal level. Transistor 734 may be turned off. As a result, the value of I1 may be reduced by an additional current amount, causing the slope of signal portion 861 to further decrease. As shown in FIG. 8, signal portion 861 may have a signal segment 814 with a slope less than that of signal segment 813. As the voltage at output node 704 continues to rise from V3 to V7, transistor 731 may be the only transistor that is turned on.

At time T1, the IN signal may fall to V0, transistor 731 may be turned off. I1 may stop flowing. Some time after time T1, transistor 741 may be turned on. Each of the CTL4, CTL5, and CTL6 signals may change to a high signal level. Transistors 742, 743, and 744 may be turned on. Thus, all transistors 741, 742, 743, and 744 may be turned on some time after time T1. I2 may be generated and flow between output node 704 and supply node 792. Signal segment 821 may be generated.

When the voltage at output node 704 is equal to or less than V4, logic AND gate 774 may change the CTL4 signal to a low signal level. Transistor 744 may be turned off. As a result, the value of I2 may be reduced by some current amount, causing the slope of signal portion 862 to decrease. As shown in FIG. 8, signal portion 862 may have a signal segment 822 with a slope less than that of signal segment 821.

When the voltage at output node 704 is equal to or less than V5, logic AND gate 773 may change the CTL5 signal to a low signal level. Transistor 743 may be turned off. As a result, the value of I2 may be reduced by another current amount, causing the slope of signal portion 862 to decrease again. As shown in FIG. 8, signal portion 862 may have a signal segment 823 with a slope less than that of signal segment 822.

When the voltage at output node 704 is equal to or less than V6, logic AND gate 772 may change the CTL6 signal to a low signal level. Transistor 742 may be turned off. As a result, the value of I2 may be reduced by an additional current amount, causing the slope of signal portion 862 to further decrease. As shown in FIG. 8, signal portion 862 may have a signal segment 824 with a slope less than that of signal segment 823. As the voltage at output node 704 continues to decrease from V6 to V0, transistor 741 may be the only transistor that is turned on. The OUT signal may have similar segmented signal shape after time T2, as is shown between times T0 and T2.

As described above, output driver 702 may vary I1 and I2 based on the voltage at output node 704 to control the signal shape of the OUT signal such that the OUT signal may have relatively low EMI emission characteristics compared to what might occur if the OUT signal was given a more square-wave like shape, rather than the segmented shape shown in FIG. 2, FIG. 4, FIG. 6, and FIG. 8.

In some embodiments, output driver 702 may be programmable to adjust the switching thresholds of logic OR gates 762, 763, and 764 and logic AND gates 772, 773, and 774 such that different signal shapes for the OUT signal in FIG. 7 may be obtained. For example, in some embodiments, the switching thresholds of logic OR gates 762, 763, and 764 and logic AND gates 772, 773, and 774 may be adjusted by adjusting the built-in reference voltages of logic OR gates 762, 763, and 764 and logic AND gates 772, 773, and 774.

In some embodiments, each of the logic OR gates 762, 763, and 764 may include an embodiment of a logic OR gate arrangement of FIG. 9. In some embodiments, each of logic AND gates 772, 773, and 774 may a logic AND gate arrangement of FIG. 10.

FIG. 9 shows an example of a logic OR gate arrangement 900 according to an embodiment of the invention. Logic OR gate arrangement 900 includes transistors 981 and 982 (p-channel transistors), transistors 983 and 984 (n-channel transistors), inverter 985, a supply node 991 with a voltage VDD, and a supply node 992 with a voltage VSS. Logic OR gate arrangement 900 may receive input signals IN* and OUT, which may be similar to or identical to those IN* and OUT signals described with reference to FIG. 3 though FIG. 8. Logic OR gate arrangement 900 may provide a control signal CTL, which may be similar to or identical to one of CTL1, CTL2, and CTL3 signals described with reference to FIG. 3 though FIG. 8.

As shown in FIG. 9, logic OR gate arrangement 900 has a similar schematic arrangement to a conventional OR gate except that transistors 981 and 982, and transistors 983 and 984 of FIG. 9 have a scaled aspect ratio in comparison with transistors of a conventional OR gate. Thus, logic OR gate arrangement 900 may be referred to as a "skewed" logic OR gate instead of a conventional "regular" logic OR gate. The reasons for the scaled aspect ratio of logic OR gate arrangement 900 is explained below.

Labels TP and TN in FIG. 9 indicate the scale factors of transistors in logic OR gate arrangement 900. For example, TN=8 indicates that each of transistors 983 and 984 has a scale factor of eight (e.g., each of transistors 983 and 984 includes eight transistors connected in parallel). TP=2 indicates that each of transistors 981 and 982 has a scale factor of two. The scaled aspect ratio of transistors 981 and 982 to transistors 983 and 984 may be determined as follows. When both the IN* or OUT signals have a low signal level, transistors 981 and 982 are turned on, transistors 983 and 984 are turned off, the scale factor of the two series connected transistors 981 and 982 is one (2/2=1, i.e., TP=2 divided by the number of two transistors 981 and 982). When one of the IN* and OUT signals (e.g., the OUT signal) is changed from the low signal level to a high signal level, one of transistors 983 and 984 (e.g., transistor 983) is turned on. Thus, in the example of FIG. 9, the scaled aspect ratio of transistors 981 and 982 to transistors 983 and 984 is 1/8 (the scale factor of the two series connected transistors 981 and 982, one, divided by the scale factor of transistor 983, eight). This gives a switching threshold of about 0.25*VDD for logic OR gate arrangement 900. Thus, when both the IN* and OUT signals have a low signal level, either the IN* or OUT signal may have to rise to a voltage that is greater than or equal to about 0.25*VDD for logic OR gate arrangement 900 to change the CTL signal from a low signal level to a high signal level. The relationship between the switching threshold of logic OR gate 900 and the scaled aspect ratio of transistors 981 and 982 to transistors 983 and 984 is described with reference to equations (1), (2), and (3) below.

The scaled aspect ratio of transistors 981 and 982 to transistors 983 and 984 of logic OR gate arrangement 900 may allow logic OR gate arrangement 900 to be used as a voltage comparator with built-in reference voltage for purposes of providing a control signal (e.g., CTL1 of FIG. 7) to turn off a transistor (e.g., transistor 732 of FIG. 7) based on different voltages at a node (e.g., output node 704 of FIG. 7). Thus, in some embodiments, logic OR gate arrangement 900 may be substituted for one or more of logic OR gate 762, 763, and 764 of FIG. 7.

FIG. 9 shows an example where the scaled aspect ratio of transistors 981 and 982 to transistors 983 and 984 is 1/8 with a corresponding switch threshold of 0.25*VDD. In some embodiments, the scale factor of each of transistors 981, 982, 983, and 984 may be changed to obtain different scaled aspect ratios corresponding to different switch thresholds.

For example, in FIG. 9, TN may be changed to 0.5 to obtain a scaled aspect ratio of two, which gives a switching threshold of about 0.5*VDD for logic OR gate arrangement 900. Thus, in this example, when both the IN* and OUT signals have a low signal level, either the IN* or OUT signal may have rise to or above 0.5*VDD for logic OR gate arrangement 900 to change the CTL signal from a low signal level to a high signal level.

In another example, in FIG. 9, TP may be changed to 32 and TN may be changed to 0.5 to obtain a scaled aspect ratio of 32, which gives a switching threshold of about 0.75*VDD for logic OR gate arrangement 900. Thus, in this example, when both the IN* and OUT signals have a low signal level, either the IN* or OUT signal may have rise to or above 0.75*VDD for logic OR gate arrangement 900 to change the CTL signal from a low signal level to a high signal level.

As described above, logic OR gate arrangement 900 may include different scale factors TP for transistors 981 and 982 and TN for transistors 983 and 984 to provide logic OR gate arrangement 900 with different switching thresholds. Thus, in some embodiments, the switching threshold of logic OR gate arrangement 900 may be adjusted to allow logic OR gate arrangement 900 to change the CLT signal from one signal level to another signal level based on different voltage relationships between VDD and the combination of the IN* and OUT signals.

In some embodiments, logic OR gate arrangement 900 may be programmable to adjust its switching threshold by adjusting the scaled aspect ratio of transistors 981 and 982 to transistors 983 and 984. For example, in FIG. 9, instead of having TN=8, TN may be programmed to be 16 such that the scaled aspect ratio of transistors 981 and 982 to transistors 983 and 984 may become 1/16 (instead of a scaled aspect ratio of 1/8 where TN=8 before programming). In some embodiments, for each of transistors 981 and 982, programming TN from eight to 16 may involve adding or making effective (e.g., enabling) eight additional n-channel transistors for each of transistors 981 and 982 (the eight additional n-channel transistors may exist in logic OR gate arrangement 900 before programming but may be made ineffective when TN=8)

The following equations show the relationship between logic OR gate 900 and the scaled aspect ratio of transistors 981 and 982 to transistors 983 and 984.

For MOS transistors such as transistors 981, 982, 983, and 984 of FIG. 9, the transistor drain-to-source current in saturation is $Ids=(\mu Cox/2)*(W/L)*(Vgs-Vth)^2$, where $\mu$ is the mobility of the electrons, Cox is the gate oxide capacitance per unit area, Vgs is the transistor gate-to-source voltage, Vth is the transistor threshold voltage. For logic OR gate 900, the current flowing in a PMOS transistor (e.g., transistor 981 or 982) and in an NMOS transistor (e.g., transistor 983 or 984) may be equal when the switching thresholds are balanced, i.e., $Idsp=Idsn=(\mu p\ Coxp/2)*(Wp/Lp)\ (Vgsp-Vthp)^2=(\mu n\ Coxn/2)*(Wn/Ln)\ (Vgsn-Vthn)^2$, where Idsp and Idsn are respectively the PMOS and NMOS transistor drain-to-source currents in saturation, Vgsp and Vgsn are respectively the transistor gate-to-source voltages of the PMOS and NMOS transistors, Vthp and Vthn are respectively the transistor threshold voltages of the PMOS and NMOS transistors, Wp and Lp are respectively channel width and length of the PMOS transistor, and Wn and Ln are respectively channel width and length of the NMOS transistor. In general, NMOS transistors have twice as much mobility as PMOS transistors and assuming Coxp=Coxn, where Coxp is the PMOS gate oxide capacitance per unit area, and Coxn is the NMOS gate oxide capacitance per unit area. Thus, Idsn may be equal to Idsp and may be expressed by equation (1) below.

$$(Wp/Lp)\ (Vgsp-Vthp)^2=2*(Wn/Ln)\ (Vgsn-Vthn)^2 \qquad (1)$$

With the assumption of Lp=Ln and Vthp=Vthn, equation (1) may be come equation (2).

$$Wp*(Vgsp-Vthp)^2=2Wn*(Vgsn-Vthn)^2 \qquad (2)$$

or $$Wp/2Wn=(Vgsn-Vthn)^2/(Vgsp-Vthp)^2 \qquad (3)$$

Based on equation (3), the relationship between the switching threshold of logic OR gate 900 and the scaled aspect ratio of transistors 981 and 982 to transistors 983 and 984 may be determined.

For example, for a switching threshold of about 0.25*VDD (or VDD/4) for logic OR gate 900, as described above, the scaled aspect ratio of transistors 981 and 982 to transistors 983 and 984 may be determined from equation (3) as follows:

$Wp/2Wn=((VDD/4)-(VDD/8))^2/((3*VDD/4)-(VDD/4))^2$ or $Wp/2Wn=(1/8)^2/(1/2)^2=(1/4)^2=1/16$. Thus, $Wp/Wn=1/8$ In another example, for a switching threshold of about 0.5*VDD for logic OR gate 900, as described above, the scaled aspect ratio of transistors 981 and 982 to transistors 983 and 984 may be determined from equation (3) as follows:

For a switching threshold of about 0.5*VDD, Vgsn−Vthn=Vgsp−Vthp. Thus, from equation (3), Wp/2Wn=1. Therefore, Wp/Wn=2

In further example, for a switching threshold of about 0.75*VDD for logic OR gate 900, as described above, the scaled aspect ratio of transistors 981 and 982 to transistors 983 and 984 may be determined from equation (3) as follows:

$Wp/2Wn=(4)^2/(1)^2$ or $Wp/2Wn=16/1$. Thus, $Wp/Wn=32$

FIG. 10 shows an example of a logic AND gate arrangement 1000 according to an embodiment of the invention. Logic AND gate arrangement 1000 includes transistors 1081 and 1082, transistors 1083 and 1084, inverter 1085, a supply node 1091 with a voltage VDD, and a supply node 1092 with a voltage VSS. Logic AND gate arrangement 1000 may receive input signals IN* and OUT, which may be similar to or identical to those IN* and OUT signals described with reference to FIG. 3 though FIG. 9. Logic AND gate arrangement 1000 may provide a control signal CTL, which may be similar to one of CTL4, CTL5, and CTL6 signals described with reference to FIG. 3 though FIG. 8.

As shown in FIG. 10, logic AND gate arrangement 1000 has a similar schematic arrangement to a conventional AND gate except that transistors 1081 and 1082, and transistors 1083 and 1084 have a scaled aspect ratio in comparison with transistors of a conventional AND gate. Thus, logic AND gate arrangement 1000 may be referred to as a "skewed" logic AND gate instead of a conventional "regular" logic AND gate. The reasons for the scaled aspect ratio of logic AND gate arrangement 1000 is explained below.

Labels TP and TN in FIG. 10 indicate the scale factors of transistors in logic AND gate arrangement 1000. For example, TP=16 indicates that each of transistors 1081 and 1082 has a scale factor of 16 (e.g., each of transistors 1081 and 1082 has 16 transistors connected in parallel). TN=1 indicates that each of transistors 1083 and 1084 has a scale factor of 1. The scaled aspect ratio of transistors 1081 and 1082 to transistors 1083 and 1084 may be determined as follows. When both the IN* and OUT signals have a high signal level, transistors 1083 and 1084 are turned on, transistors 1081 and 1082 are turned off, the scale factor of the two series connected transistors 1083 and 1084 is 0.5 (1/2=0.5, i.e., TN=1 divided by the number of two transistors 1083 and 1084). When one of the IN* and OUT signals (e.g., the OUT signal) is changed from the high signal level to a low signal level, one of transistors 1081 and 1082 (e.g., transistor 1082) is turned on. Thus, in the example of FIG. 10, the scaled aspect ratio of transistors 1081 and 1082 to transistors 1083 and 1084 is 32 (or 16/0.5, which is the scale factor of transistor 1082, 16, divided by the scale factor of the two series connected transistors 1083 and 1084, 0.5). This gives a switching threshold of about 0.75*VDD for logic AND gate arrangement 1000. Thus, when both the IN* and OUT signals have a high signal level, either the IN* or OUT signal may have to fall to the level of, or below the level of 0.75*VDD for logic AND gate arrangement 1000 to change the CTL signal from a high signal level to a low signal level. The relationship between the switching threshold of logic AND gate 1000 and the scaled aspect ratio of transistors 1081 and 1082 to transistors 1083 and 1084 may be determined by equations (1), (2), and (3) above.

The scaled aspect ratio of transistors 1081 and 1082 to transistors 1083 and 1084 of logic AND gate arrangement 1000 may allow logic AND gate arrangement 1000 to be used as a voltage comparator with a built-in reference voltage for purposes of providing a control signal (e.g., CTL4 of FIG. 7)

to turn off a transistor (e.g., transistor 744 of FIG. 7) based on different voltages at a node (e.g., output node 704 of FIG. 7). Thus, in some embodiments, logic AND gate arrangement 1000 may be substituted for one or more of logic AND gates 772, 773, and 774 of FIG. 7.

FIG. 10 shows an example where the scaled aspect ratio of transistors 1081 and 1082 to transistors 1083 and 1084 is 32 with a corresponding switch threshold of 0.75*VDD. In some embodiments, the scale factor of each of transistors 1081, 1082, 1083, and 1084 may be changed to obtain different scaled aspect ratios corresponding to different switch thresholds.

For example, in FIG. 10, TP may be changed to one to obtain a scaled aspect ratio of two, which gives a switching threshold of about 0.5*VDD for logic AND gate arrangement 1000. Thus, in this example, when both the IN* and OUT signals have a high signal level, either the IN* or OUT signal may have to fall to or below the voltage level 0.5*VDD for logic AND gate arrangement 1000 to change the CTL signal from a high signal level to a low signal level.

In another example, in FIG. 10, TP may be changed to one and TN may be changed to 16 to obtain a scaled aspect ratio of 1/8, which gives a switching threshold of about 0.25*VDD for logic AND gate arrangement 1000. Thus, in this example, when both the IN* and OUT signals are at a high signal level, either the IN* or OUT signal may have to fall to or below the voltage level 0.25*VDD for logic AND gate arrangement 1000 to change the CTL signal from a high signal level to a low signal level.

As described above, logic AND gate arrangement 1000 may include different scale factors TP for transistors 1081 and 1082 and TN for transistors 1083 and 1084 to provide logic AND gate arrangement 1000 with different switching thresholds. Thus, in some embodiments, the switching threshold of logic AND gate arrangement 1000 may be adjusted to allow logic AND gate arrangement 1000 to change the CLT signal from one signal level to another signal level based on different voltage relationships between VDD and the combination of the IN* and OUT signals.

In some embodiments, logic AND gate arrangement 1000 may be programmable to adjust its switching threshold by adjusting the scaled aspect ratio of transistors 1081 and 1082 to transistors 1083 and 1084. For example, in FIG. 10, instead of TP=16, TP may be programmed to be eight such that the scaled aspect ratio of transistors 1081 and 1082 to transistors 1083 and 1084 may be 16 (instead of a scaled aspect ratio of 32 where TP=16 before programming). In some embodiments, programming TP from 16 to eight may involve removing or making ineffective (e.g., disabling) eight p-channel transistors from each of transistors 1081 and 1082 (after programming, eight of the 16 transistors 1081 may be made effective and the other eight may be made ineffective, eight of the 16 transistors 1082 may be made effective and the other eight may be made ineffective).

Figure 11:
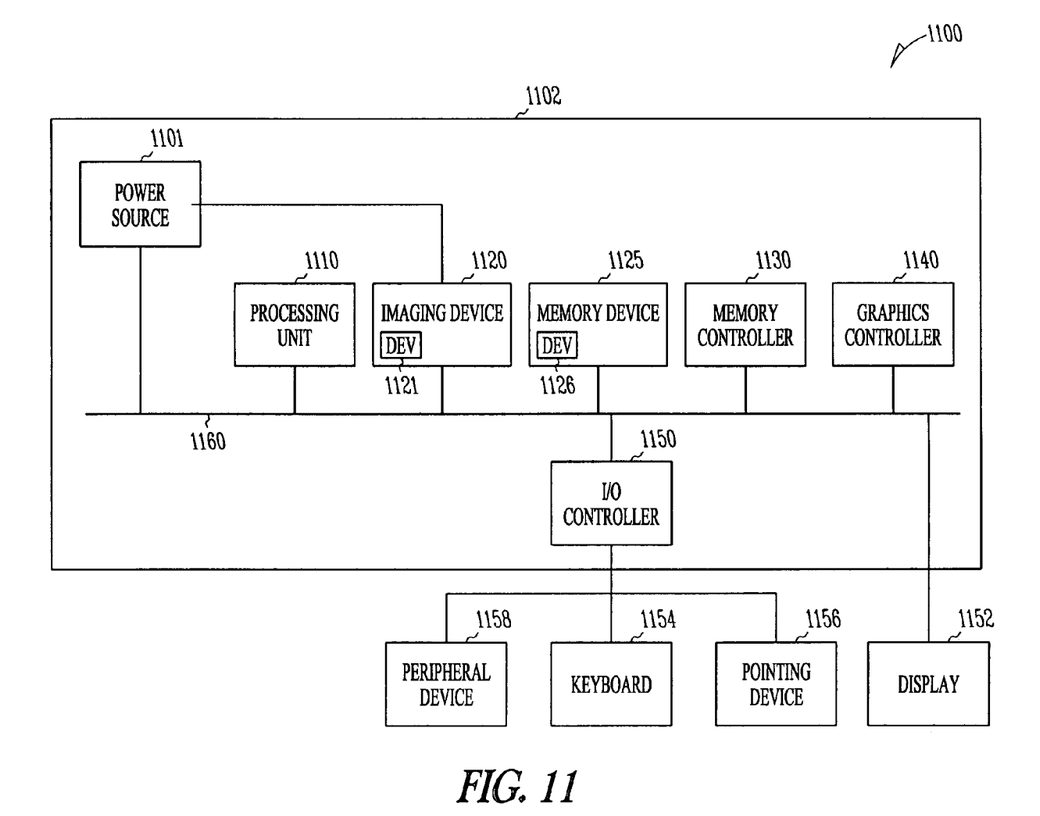
FIG. 11 shows a system according an embodiment of the invention.

FIG. 11 shows an embodiment of a system 1100 including a processing unit 1110, an imaging device 1120, a memory device 1125, a memory controller 1130, a graphics controller 1140, an input and output (I/O) controller 1150, a display 1152, a keyboard 1154, a pointing device 1156, a peripheral device 1158, and a bus 1160. System 1100 may also include a circuit board 1102 on which some components of the system 1100 are located, as shown in FIG. 11. Power source 1101 may include alternating current to direct current (AC to DC) conversion circuitry, DC to DC conversion circuitry, a battery, and combinations of these.

In some embodiments, system 1100 may include fewer components than those shown in FIG. 1100. In other embodiments, system 1100 may include more components than those shown in FIG. 1100.

In FIG. 11, imaging device 1120 may include a CMOS image sensor device or a charge-coupled device (CCD). In some embodiments, imaging device 1120 may include a device (DEV) 1121 in which device 1121 may include an embodiment of a device that is similar to or identical to device 100 of FIG. 1. Thus, in some embodiments, imaging device 1120 may include a semiconductor chip, such as semiconductor chip 110 of FIG. 1, including a pixel array and at least one output port with at least one output driver (e.g., output driver 102, 302, 502, or 702 of FIG. 1, FIG. 3, FIG. 5, or FIG. 7) coupled to the pixel array to communicate information from the pixel array to at least one output node of the semiconductor device.

Memory device 1125 of FIG. 11 may include a volatile memory device, a non-volatile memory device, or a combination of both. For example, memory device 1125 may include a dynamic random access memory (DRAM) device, a static random access memory (SRAM) device, a flash memory device, or a combination of these memory devices. In some embodiments, memory device 1125 may include device (DEV) 1126 in which device 1126 may include an embodiment of device 110 of FIG. 1. Indeed, although not shown for purposes of improved clarity, any of the elements 1101, 1110, 1130, 1140, 1150, 1152, 1154, 1156, and 1158 may include one or more embodiments of device 100.

I/O controller 1150 may include a communication module for wired or wireless communication. In some embodiments, the number of components of system 1100 may vary.

Processing unit 1110 may process data transferred to and from other component elements shown in the figure via bus 1160. Processing unit 1110 may include a general-purpose processor or an application specific integrated circuit (ASIC). Processing unit 1110 may include a single core processing unit or a multiple-core processing unit.

System 100 may include computers (e.g., desktops, laptops, handhelds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The above description and the drawings illustrate some example embodiments of the invention. Other embodiments may incorporate structural, logical, electrical, process, and other changes. In the drawings, like features or like numerals describe substantially similar features. Examples merely show possible variations. Portions and features of some embodiments may be included in, or substituted for, those of others. Many other embodiments will be apparent to those of skill in the art upon reading and understanding the above description. Therefore, the scope of various embodiments of the present disclosure is determined by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus comprising:
   an output node to provide an output signal;
   a first circuit to provide a plurality of first parallel circuit paths between the output node and a first supply node during a first time interval;
   a second circuit to provide a plurality of second parallel circuit paths between the output node and a second supply node during a second time interval; and
   a control circuit responsive to a voltage at the output node to vary a value of a first current in the plurality of first parallel circuit paths to control a signal shape of a first signal portion of the output signal during the first time interval, and to vary a value of a second current in the plurality of second parallel circuit paths to control a signal shape of a second signal portion of the output signal during the second time interval, wherein:
   the control circuit is to provide a plurality of comparison results based on a plurality of comparisons between the voltage at the output node and a corresponding plurality of node voltages received at a plurality of nodes included in the control circuit;
   the control circuit is to vary the value of the first current and the value the second current based on the plurality of comparison results;
   one of the first supply node and the second supply node is to receive a supply voltage;
   each voltage of the plurality of node voltages is substantially proportional to the supply voltage; and
   the plurality of nodes is to receive the plurality of node voltages having a first voltage, a second voltage greater than the first voltage, and a third voltage greater than the second voltage.

2. The apparatus of claim 1, wherein the output node is to provide the output signal with a cycle time, wherein the first time interval corresponds to a first portion of the cycle time, and wherein the second time interval corresponds to a second portion of the cycle time.

3. The apparatus of claim 1, wherein the control circuit is to disable at least one circuit path of the plurality of first parallel circuit paths during the first time interval, and wherein the control circuit is to disable at least one circuit path of the plurality of second parallel circuit paths during the second time interval.

4. The apparatus of claim 1, wherein the control circuit is to disable one circuit path of the plurality of first parallel circuit paths when the voltage at the output node is at least equal to the first voltage during the first time interval, and wherein the control circuit is to disable at least two circuit paths of the plurality of first parallel circuit paths when the voltage at the output node is at least equal to the second voltage that is greater than the first voltage during the first time interval.

5. The apparatus of claim 4, wherein the control circuit is to disable one circuit path of the plurality of second parallel circuit paths when the voltage at the output node is less than a fourth voltage during the second time interval, and wherein the control circuit is to disable at least two circuit paths of the plurality of first parallel circuit paths when the voltage at the output node is less than a fifth voltage during the second time interval.

6. The apparatus of claim 1, wherein the control circuit is programmable to adjust a voltage value of the first voltage, to adjust a voltage value of the second voltage, and to adjust a voltage value of the third voltage.

7. An apparatus comprising:
   an output node, a first supply node, and a second supply node;
   a plurality of first transistors coupled in parallel between the output node and the first supply node, each of the plurality of first transistors including a gate;
   a plurality of first comparators, each of the plurality of first comparators including a first input node coupled to the output node, a second input node to receive a first node voltage, and a comparator output node coupled to the gate of one of the plurality of first transistors;
   a plurality of second transistors coupled in parallel between the output node and the second supply node, each of the plurality of second transistors including a gate; and
   a plurality of second comparators, each of the plurality of second comparators including a first input node coupled to the output node, a second input node to receive a second node voltage, and a comparator output node coupled to the gate of one of the plurality of second transistors.

8. The apparatus of claim 7, wherein the plurality of first comparators is to turn off at least one transistor in the plurality of first transistors when a voltage at the output node is at least equal to a first voltage during a first time interval, and wherein the plurality of first comparators is to turn off at least two transistors of the plurality of first transistors when the voltage at the output node is at least equal to a second voltage greater than the first voltage during the first time interval.

9. The apparatus of claim 8, wherein the plurality of second comparators is to turn off at least one transistor in the plurality of second transistors when the voltage at the output node is less than a third voltage during a second time interval, and wherein the plurality of second comparators is to turn off at least two transistors of the plurality of second transistors when the voltage at the output node is less than a fourth voltage during the second time interval.

10. The apparatus of claim 7, wherein the plurality of first comparators is to turn off at least one transistor in the plurality of first transistors when a voltage at the output node is at least equal to a first voltage during the first time interval, and wherein the plurality of first comparators is to turn off the plurality of first transistors when the voltage at the output node is at least equal to a second voltage greater than the first voltage during the first time interval.

11. The apparatus of claim 10, wherein the plurality of second comparators is to turn off at least one transistor in the plurality of second transistors when the voltage at the output node is less than a third voltage during the second time interval, and wherein the plurality of second comparators is to turn off the plurality of second transistors when the voltage at the output node is less than a fourth voltage during the second time interval.

12. The apparatus of claim 7, wherein each of the first node voltages has a different voltage value.

13. The apparatus of claim 12, wherein each of the second node voltages has a different voltage value.

14. The apparatus of claim 7, wherein a selected comparator of the plurality of first comparators includes a plurality of transistors arranged in a logic OR gate arrangement with a first OR gate input node coupled to the first input node of the selected comparator, a second OR gate input node coupled to the second input node of the selected comparator, and an OR gate output node coupled to the comparator output node of the selected comparator.

15. The apparatus of claim 14, wherein a selected comparator of the plurality of second comparators includes a plurality of transistors arranged in a logic AND arrangement with a first AND gate input node coupled to the first input node of the selected comparator, a second AND gate input node coupled to the second input node of the selected comparator, and an AND gate output node coupled to the comparator output node of the selected comparator.

16. The apparatus of claim 15, wherein at least two transistors of the plurality of transistors of each of the plurality of second comparators have different scale factors.

17. The apparatus of claim 14, wherein at least two transistors of the plurality of transistors of each of the plurality of first comparators have different scale factors.

18. The apparatus of claim 7, wherein one of the plurality of first transistors and one of the plurality of second transistors form an inverter, wherein the inverter includes an inverter input node to receive an input signal, and an inverter output node coupled to the output node.

19. The apparatus of claim 18, wherein the second input node of each of the plurality of first comparators is coupled to the inverter input node, and wherein the fourth input node of each of the plurality of second comparators is coupled to the inverter input node.

20. The apparatus of claim 19, wherein the plurality of first transistors includes transistors of a first transistor type, and wherein the plurality of second transistors includes transistors of a second transistor type.

21. The apparatus of claim 20, wherein each transistor of the plurality of first transistors includes a field effect transistor, and wherein each transistor of the plurality of second transistors includes a field effect transistor.

22. A method comprising:
receiving an input signal;
generating a first current in a plurality of first parallel circuit paths between a first supply node and an output node in response to the input signal to produce a first signal portion of an output signal at the output node during a first time interval;
generating a second current in a plurality of second parallel circuit paths between a second supply node and the output node in response to the input signal to produce a second signal portion of the output signal at the output node during a second time interval;
varying a value of the first current to control a signal shape of the first signal portion of the output signal; and
varying a value of the second current to control a signal shape of the second signal portion of the output signal, wherein varying the value of the first current includes reducing the value of the first current by a first current amount when a voltage at the output node is at least equal to a first voltage and wherein varying the value of the second current includes reducing the value of the second current by a second current amount when the voltage at the output node is less than a second voltage.

23. The method of claim 22, wherein varying the value of the first current includes reducing the value of the first current by a third current amount when the voltage at the output node is at least equal to a third voltage.

24. The method of claim 23, wherein varying the value of the second current includes reducing the value of the second current by a fourth current amount when the voltage at the output node is less than a fourth voltage.

25. The method of claim 24, wherein the second voltage is greater than the first voltage, and wherein the third voltage is greater than the fourth voltage.

26. The method of claim 22, wherein varying the value of the first current includes disabling at least one circuit path of the plurality of first parallel circuit paths during the first time interval.

27. The method of claim 26, wherein varying the value of the second current includes disabling at least one circuit path of the plurality of second parallel circuit paths during the second time interval.

28. The method of claim 22, wherein varying the value of the first current includes:
comparing a voltage at the output node during the first time interval with a first voltage to provide a first comparison result; and
reducing the value of the first current based on the first comparison result.

29. The method of claim 28, wherein varying the value of the second current includes:
comparing a voltage at the output node during the second time interval with a second voltage to provide a second comparison result; and
reducing the value of the second current based on the second comparison result.

30. The method of claim 22, wherein producing the first signal portion of the output signal includes producing a plurality of signal segments having different slopes, and wherein each of the signal segments corresponds to a different value of the first current.

31. The method of claim 22, wherein producing the second signal portion of the output signal includes producing a plurality of signal segments having different slopes, and wherein each of the signal segments of the second signal portion corresponds to a different value of the second current.

32. A method comprising:
receiving an input signal;
generating a first current in a plurality of first parallel circuit paths between a first supply node and an output node in response to the input signal to produce a first signal portion of an output signal at the output node during a first time interval;
generating a second current in a plurality of second parallel circuit paths between a second supply node and the output node in response to the input signal to produce a second signal portion of the output signal at the output node during a second time interval;
varying a value of the first current to control a signal shape of the first signal portion of the output signal; and
varying a value of the second current to control a signal shape of the second signal portion of the output signal, wherein varying the value of the first current includes:
reducing the value of the first current by a first current amount in response to a first voltage at the output node to produce a first signal segment of a plurality of signal segments of the first signal portion of the output signal; and
reducing the value of the first current by a second current amount in response to a second voltage at the output node to produce a second signal segment of the plurality of signal segments of the first signal portion of the output signal.

33. The method of claim 32, wherein varying the value of the second current includes:

reducing the value of the second current by a third current amount in response to a third voltage at the output node to produce a first signal segment of a plurality of signal segments of the second signal portion of the output signal; and reducing the value of the second current by a fourth current amount in response to a fourth voltage at the output node to produce a second signal segment of the plurality of signal segments of the second signal portion of the output signal.

* * * * *